(12) United States Patent
Yao et al.

(10) Patent No.: US 8,575,537 B2
(45) Date of Patent: Nov. 5, 2013

(54) COMPACT MULTI-DIRECTION PROXIMITY SENSOR DEVICE AND METHOD

(75) Inventors: Yufeng Yao, Singapore (SG); Sze Ping Ong, Singapore (SG); Rani Ramamoorthy Saravanan, Singapore (SG); Wee Sin Tan, Singapore (SG)

(73) Assignee: Avago Technologies General IP (Singapore) Pte. Ltd., Singapore (SG)

( * ) Notice: Subject to any disclaimer, the term of this patent is extended or adjusted under 35 U.S.C. 154(b) by 355 days.

(21) Appl. No.: 12/964,227

(22) Filed: Dec. 9, 2010

(65) Prior Publication Data

US 2012/0145932 A1 Jun. 14, 2012

(51) Int. Cl.
*G06M 7/00* (2006.01)
(52) U.S. Cl.
USPC .......................................... 250/221
(58) Field of Classification Search
USPC .......................................... 250/221
See application file for complete search history.

(56) References Cited

U.S. PATENT DOCUMENTS

| | | | |
|---|---|---|---|
| 4,564,756 A | 1/1986 | Johnson | |
| 5,319,201 A * | 6/1994 | Lee | 250/349 |
| 5,506,567 A * | 4/1996 | Bichlmaier et al. | 340/555 |
| 5,991,040 A | 11/1999 | Doemens et al. | |
| 6,021,373 A | 2/2000 | Zuercher et al. | |
| 6,465,774 B1 | 10/2002 | Walker, Jr. et al. | |
| 6,794,639 B2 | 9/2004 | Lautenschlager et al. | |
| 7,248,955 B2 | 7/2007 | Hein et al. | |
| 7,368,703 B2 * | 5/2008 | De Samber et al. | 250/221 |
| 7,557,690 B2 | 7/2009 | McMahon | |
| 2002/0104957 A1* | 8/2002 | Liess et al. | 250/221 |
| 2007/0057166 A1* | 3/2007 | Kuo et al. | 250/221 |
| 2008/0004769 A1 | 1/2008 | Lenneman et al. | |

* cited by examiner

*Primary Examiner* — Thanh Luu

(57) ABSTRACT

A proximity sensor device is provided in compact unit that has the ability to sense or monitor in different directions, such as sensing or monitoring in both the vertical and horizontal directions. Methods are also provided. In an illustrative embodiment, the proximity sensor device includes a first transmitting/receiving pair and a second transmitting/receiving pair on a printed circuit board along with an IC to control the transmitters and receivers, as well as, in some embodiments, to provide signal filtering, amplification or other desired features.

18 Claims, 8 Drawing Sheets

COMPACT MULTI-DIRECTION PROXIMITY SENSOR DEVICE AND METHOD

BACKGROUND

Proximity sensing devices operate under a variety of principles, including inductive proximity sensors, capacitive proximity sensors and optical proximity sensors. Optical proximity sensors or switches are generally comprised of a light-emitting or transmitting component, typically a diode, and a receiving component, typically a photodiode. Among the different types of proximity sensors or switches is a reflection system, in which the transmitter and receiver are typically integrated into a single unit or device. In one type of reflection system, the light emitted by the transmitter in the transmitter/receiver device is transmitted into the area to be monitored. As long as there is no object in the area to be monitored, no light is reflected back to the receiver in the transmitter/receiver. However, if an object enters into the area to be monitored at least part of the transmitted light is reflected by the object and can be detected by the receiver in the transmitter/receiver.

For such optical sensor systems, it is necessary to exactly align the transmitting and receiving components of the optical sensor devices during manufacture and installation so that the light emitted by the transmitter is incident via reflection on the receiver for the desired monitoring range. Accordingly, manufacturing such optical sensor systems can be costly. Moreover, each transmitting/receiving unit only operates in one direction, so if a particular application calls for being able to monitor in two directions, such as monitoring on both a horizontal and vertical axis or direction sensing (clockwise vs. counterclockwise) for a motor, etc., two separate transmitting/receiving units are required, adding to the expense. Additionally, such optical sensor systems require a controller, typically an IC, to implement the driver for the light transmission, signal filtering, etc. These IC controllers are manufactured separately from the transmitting/receiving unit of the optical sensor device and typically connected to the transmitting/receiving unit at installation of the optical sensor system, which, depending on the number of transmitting/receiving units operating, can require significant design effort to implement.

SUMMARY

To address the various constraints and issues presented in conventional proximity sensors, and preferably optical sensor systems, an integrated proximity sensor device is provided in an easy to manufacture, compact unit that has the ability to sense or monitor in both the vertical and horizontal directions. In a preferred embodiment, the proximity sensor system includes a first transmitting/receiving pair and a second transmitting/receiving pair on a printed circuit board along with an integrated circuit to control the transmitters and receivers, as well as, in some embodiments, to provide signal filtering, amplification or other desired features.

An illustrative embodiment of a proximity sensor system is an optical proximity sensor, and the preferred transmitter is a modular light-emitting diode (LED) with a molded lens for ease of manufacture. Similarly, an embodiment of the receiver is a modular photodiode with a molded lens. By providing modular transmitters and receivers, the optical sensor system can be easily assembled into a compact package. Additionally, the optical sensor system has a metal shield to both protect the transmitting/receiving components and the integrated IC circuit, as well as to help block light leaking to the receiving area (i.e., reduce crosstalk).

Such a compact, dual directional optical sensor system has broad applications. For example, due to the wide angle sensing properties for the dual direction sensing, it can be used as a human presence sensor, such as detecting individuals approaching an ATM machine from various angles; used to detect the absence of a user from machinery, equipment, or computers to allow implementation of a power saving mode while the user is away; used as a direction sensor for motors to determine clockwise verses counterclockwise motion; etc.

The figures and detailed description that follow are not exhaustive. The disclosed embodiments are illustrated and described to enable one of ordinary skill to make and use the integrated optical sensor device. Other embodiments, features and advantages will be or will become apparent to those skilled in the art upon examination of the following figures and detailed description. All such additional embodiments, features and advantages are within the scope of the assemblies and methods for the manufacture thereof as defined in the accompanying claims.

BRIEF DESCRIPTION OF THE FIGURES

The proximity sensor device and methods can be better understood with reference to the following figures. The components within the figures are not necessarily to scale, emphasis instead being placed upon clearly illustrating the proximity sensor system and the principles of forming the integrated proximity sensor system. Moreover, in the figures, like reference numerals designate corresponding parts throughout the different views.

FIG. 1B illustrates a front perspective view of the transmitting unit shown in

FIG. 1A with a molded lens attached thereto.

DETAILED DESCRIPTION

The demand for an improved proximity sensor is met with a proximity sensor in an easy to manufacture, compact unit that has the ability to sense or monitor in both the vertical and horizontal directions. In an illustrative, or exemplary, embodiment, the proximity sensor includes a first transmitting/receiving pair and a second transmitting/receiving pair on one printed circuit board ("PCB") along with an integrated circuit ("IC") to control the transmitters and receivers, as well as, in some embodiments, providing signal filtering, amplification and other features, if desired.

Figure 1A:
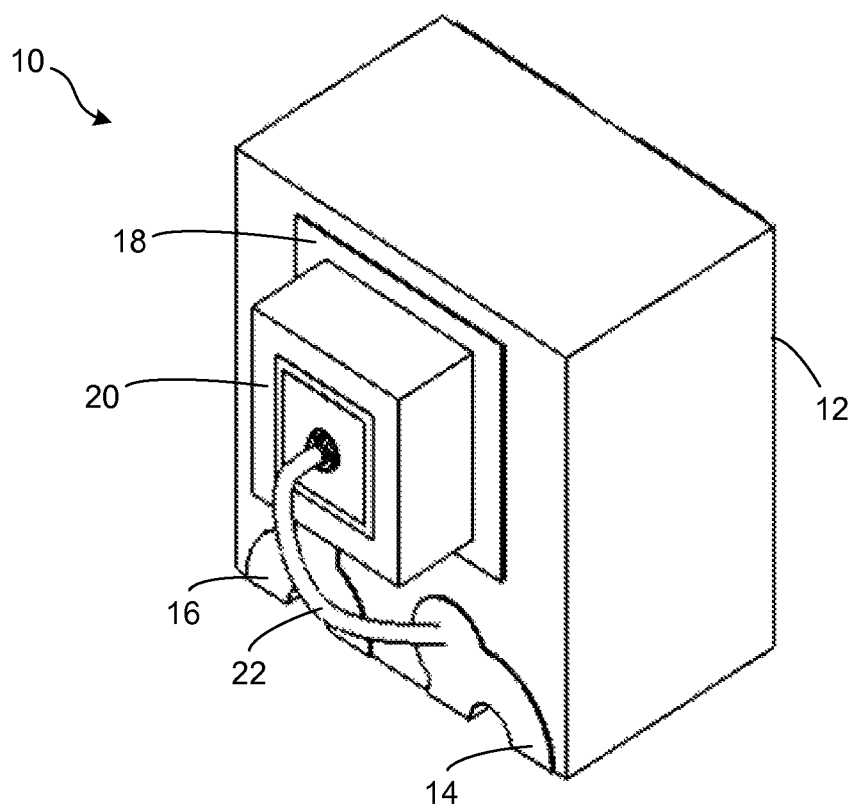
FIG. 1A illustrates a front perspective view of an embodiment of a transmitting unit for use with a proximity sensor.
Figure 1B:
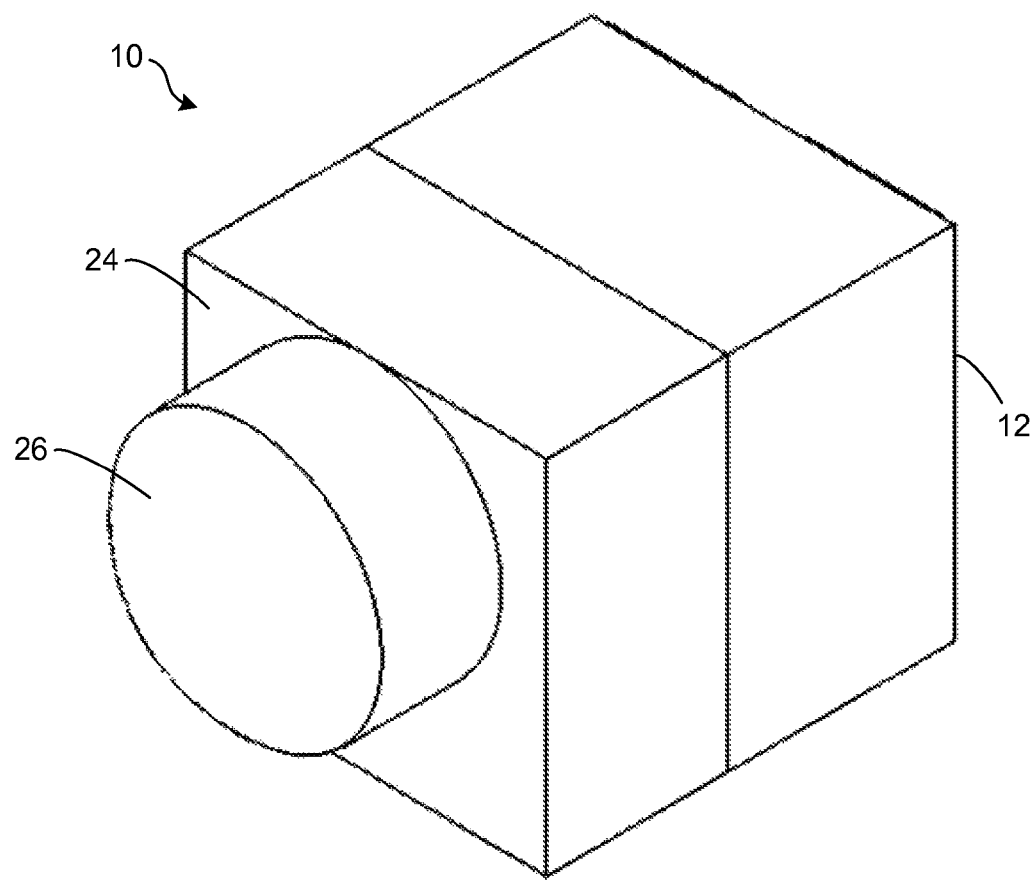

Turning now to the drawings, wherein like reference numerals designate corresponding parts throughout the drawings, reference is made to FIG. 1A and FIG. 1B, which illustrate an illustrative, or exemplary, embodiment of a transmitting unit 10 for use with a proximity sensor. In this embodiment, the proximity sensor is an optical proximity sensor. As illustrated in FIG. 1A, the transmitting unit 10 includes a transmitter substrate 12. The transmitter substrate 12 is preferably a PCB substrate. Shown generally cubic in shape in FIG. 1A, the transmitter substrate 12 could be any desired shape depending on the application for which the transmitting unit 10 is intended, although for ease of manufacture and assembly of the proximity sensor, especially when small in size, a modular transmitting unit 10 with a generally cubic or rectangular shaped transmitter substrate 12 is preferred.

The transmitter substrate 12 preferably includes conductive areas 14, 16, 18 formed on or in the transmitter substrate 12. The conductive areas 14, 16, and 18 can be formed on or in the transmitter substrate 12 in a variety of ways, as would be understood by one of skill in the art. Additionally, the conductive areas 14, 16, and 18 may be in a variety of shapes, sizes and arrangements. For instance, although three conductive areas 14, 16 and 18 are shown, more or fewer conductive areas may be used, and by way of example, conductive areas 16 and 18 could be coupled together to form, or could be formed as, one larger conductive area (not shown). The conductive areas 14, 16, and 18 are also not limited to one face of the transmitter substrate 12, but may be extended to cover in whole, or in part, other faces of the transmitter substrate 12.

As illustrated in FIG. 1A, a transmitter 20 is attached to the transmitter substrate 12. In the illustrative embodiment shown in FIG. 1A, the transmitter 20 emits light, although other types of transmitters 20 could be used. The illustrated transmitter 20 is an LED emitting infrared light, although other light-emitters and other light frequencies could be used. The illustrated transmitter 20 is attached to the transmitter substrate 12 at the conductive area 18 by die attaching, but other attaching methods or locations could be used. Additionally, the transmitter 20 is connected to conductive area 14 by a connecting wire 22.

FIG. 1B shows a transmitting unit 10 of the type illustrated in FIG. 1A with an illustrative embodiment of a molded cover 24 attached to one face of the transmitter substrate 12. Preferably, the molded cover 24 is attached to the face of the transmitter substrate 12 containing the transmitter 20, and the molded cover 24 comprises a transparent material that covers the transmitter 20. The molded cover 24 may be separately manufactured and then attached to the transmitter substrate 12 in a variety of ways, or the molded cover 24 may be formed on the transmitter substrate 12. The preferred molding 24 includes a lens portion 26 that is located over the transmitter 20 such that the lens portion 26 can be used to manipulate the light emitted from the transmitter 20 (e.g., focus the light to a desired focal point). As is known, the physical properties, dimensions and arrangement of the molded cover 24 and lens portion 26 can vary depending on how one desires to manipulate the light emitted by the transmitter 20.

A single transmitting unit 10 is shown in FIGS. 1A and 1B; however, multiple transmitting units 10 could be assembled at the same time on a larger substrate 12, and then after assembly, the larger substrate 12 may broken down into individual transmitting units 10, such as by singulation. Singulation could be performed either before or after the molded cover 24 and/or lens portion 26 are formed on the transmitting unit 10.

Figure 2A:
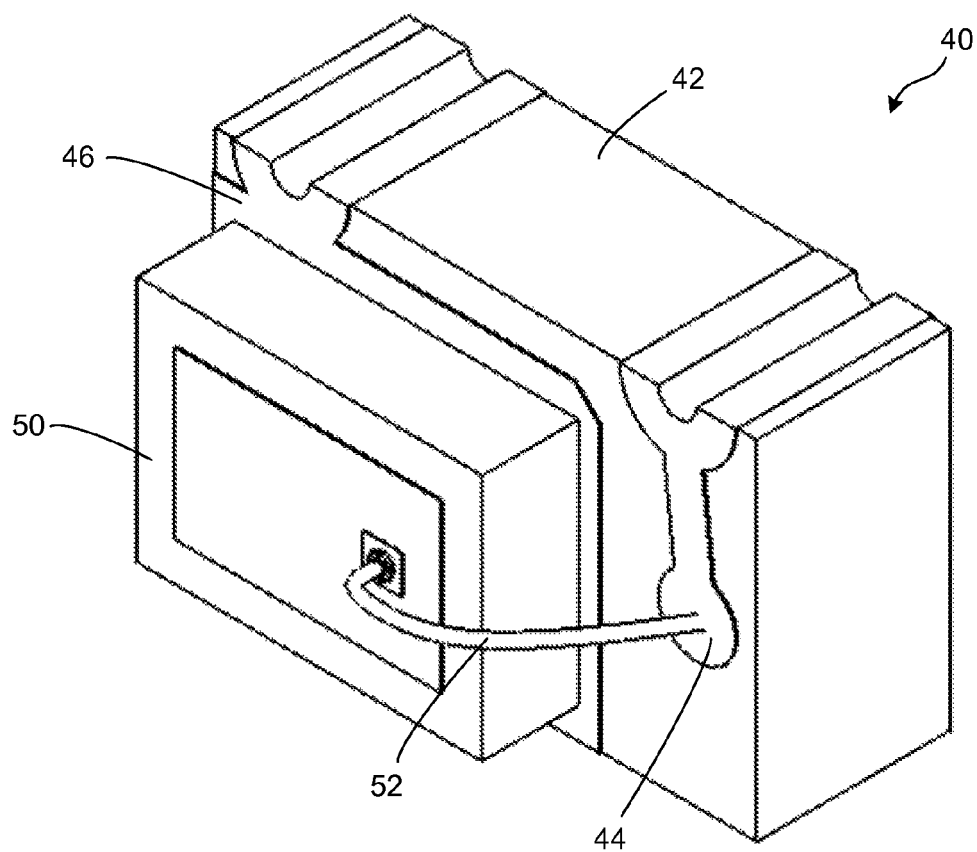
FIG. 2A illustrates a front perspective view of an embodiment of a receiving unit for use with a proximity sensor.

FIG. 2A illustrates an exemplary embodiment of a receiving unit 40 for use with a proximity sensor. The receiving unit 40 includes a receiver substrate 42. The receiver substrate 42 is typically a PCB substrate. Shown generally rectangular in shape in FIG. 2A, the receiver substrate 42 could be any desired shape depending on the application for which the receiving unit 40 is intended, although for ease of manufacture and assembly of the proximity sensor system, especially when small in size, a modular receiving unit 40 with a generally rectangular shaped receiver substrate 42 is preferred.

The receiver substrate 42 preferably includes conductive areas 44 and 46 formed on or in the receiver substrate 42. The conductive areas 44 and 46 can be formed on or in the receiver substrate 42 in a variety of ways, as would be understood by one of skill in the art. Additionally, the conductive areas 44 and 46 may be in a variety of shapes, sizes and arrangements. For instance, although two conductive areas 44 and 46 are shown, more or fewer conductive areas may be used. The conductive areas 44 and 46 are also not limited to one face of the receiver substrate 42, but may be extended to cover in whole, or in part, other faces of the receiver substrate 42 as shown in FIG. 2A.

As illustrated in FIG. 2A, a receiver 50 is attached to the receiver substrate 42. In the embodiment shown in FIG. 1A, the receiver 50 is a photodetector, although other types of receivers 50 could be used. The receiver 50 is photodiode capable of detecting infrared light, although other photodetectors and other light frequencies could be used. The illustrated receiver 50 is attached to the receiver substrate 42 at the conductive area 46 by die attaching, but other attaching methods or locations could be used. Additionally, the receiver 50 is connected to conductive area 44 by a connecting wire 52.

Figure 2B:
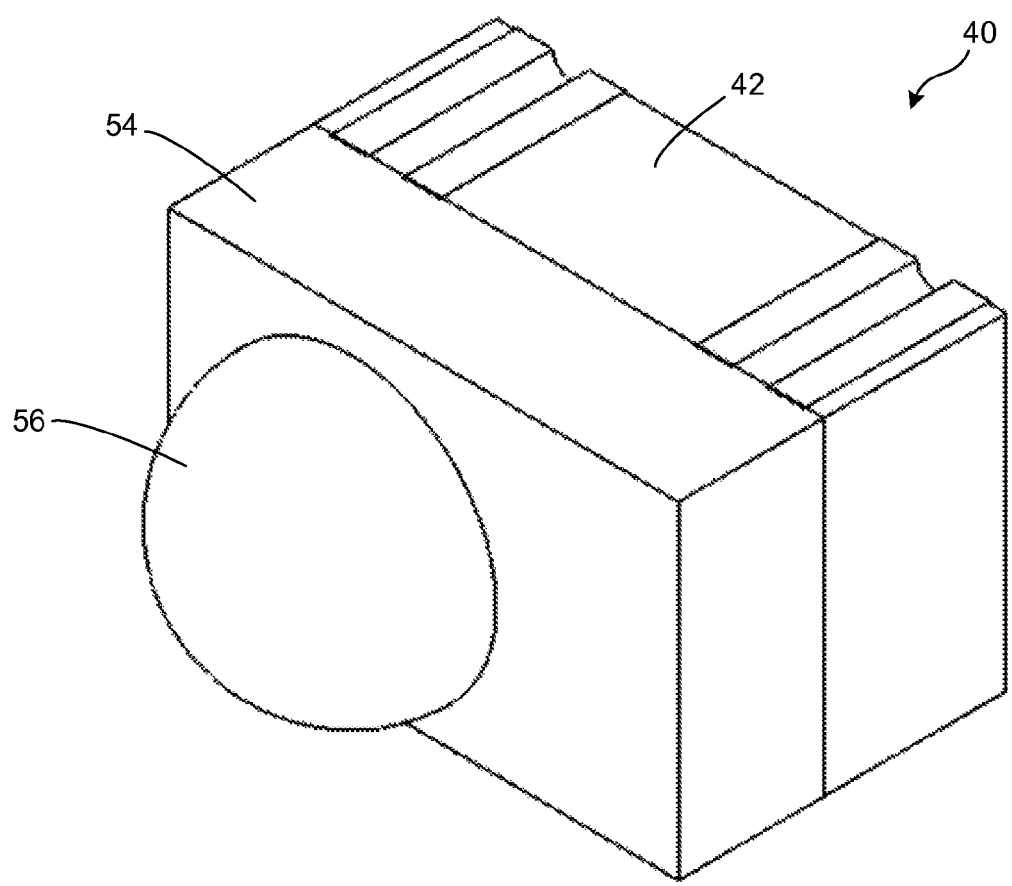
FIG. 2B illustrates a front perspective view of the receiving unit shown in FIG. 2A with a molded cover attached.

FIG. 2B shows a receiving unit 40 of the type illustrated in FIG. 2A with a molded cover 54 attached to one face of the receiver substrate 42. The molded cover 54 is attached to the face of the receiver substrate 42 containing the receiver 50, and the molded cover 54 comprises a transparent material that covers the receiver 50. The molded cover 54 may be separately manufactured and then attached to the receiver substrate 42 in a variety of ways, or the molded cover 54 may be formed on the receiver substrate 42 Additionally, the molded cover 54 includes a lens portion 56 that is located over the receiver 50 such that the lens portion 56 captures light and directs it to the receiver 50. As is known, the physical properties, dimensions and arrangement of the molded cover 54 and lens portion 56 can vary depending on how one desires to capture and direct light to the receiver 50.

A single receiving unit 40 is shown in FIGS. 2A and 2B; however, multiple receiving units 40 could be assembled at the same time on a larger substrate 42, and then after assembly, the larger substrate 42 may be broken down into individual receiving units 40, such as by singulation. Singulation could be performed either before or after the molded cover 54 and/or lens portion 56 are formed on the receiving unit 40.

Figure 3A:
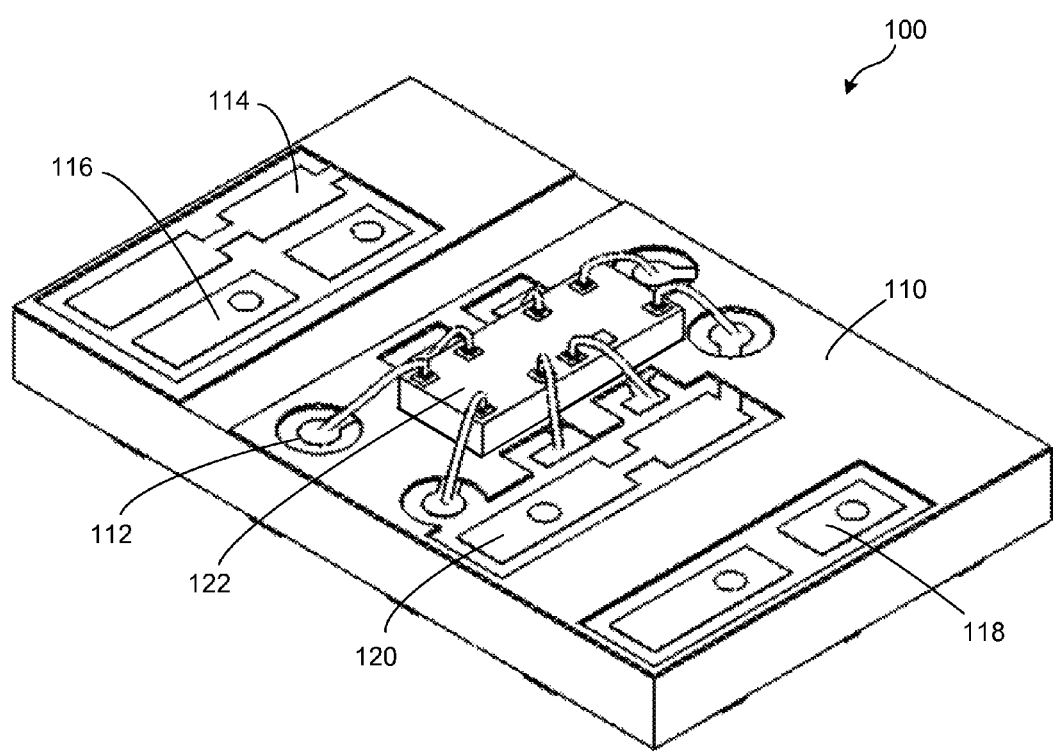
FIG. 3A illustrates a top perspective view of an embodiment of a portion of a proximity sensor device.

FIG. 3A illustrates a portion of a proximity sensor device 100, which is in the illustrative, or exemplary, embodiment an optical sensor device. The proximity sensor device 100 includes a device substrate 100 which is preferable a PCB substrate. The device substrate includes various conductive areas 112, 114, 116, 118, and 120 that allow for conducting signals and/or power to various portions of the device substrate 100. The number, shape and location of the conductive areas 112, 114, 116, 118, and 120 are not limited to what is displayed in FIG. 3A, but may vary. The embodiment of the proximity sensor device 100 also includes an integrated circuit (IC) 122 attached to the device substrate 110.

The IC 122 allows for control of the components of the proximity sensor device 100, for example, by providing logic for driving a transmitting unit 10 (not shown in FIG. 3A). Additionally, the IC 122 may also contain logic to allow for signal conditioning, sunlight, ambient light immunity, as well as other features if desired. Depending on the proposed application for the proximity sensor device 100, such as an application where the proximity sensor device 100 will be powered by a battery, the IC 122 may also contain logic to perform various power saving operations, including, but not limited to, current control for the receiving unit 40 and/or transmitting unit 10; controlling the pulse width, burst rate, duty cycle, and frequency; operating in standby mode based on various conditions; performing a shutdown based on various conditions; etc. The IC 122 can be attached to the device substrate 110 in a variety of ways, and as illustrated in FIG. 3A, may be wirebonded to various conductive regions, such as conductive region 112.

Figure 3B:
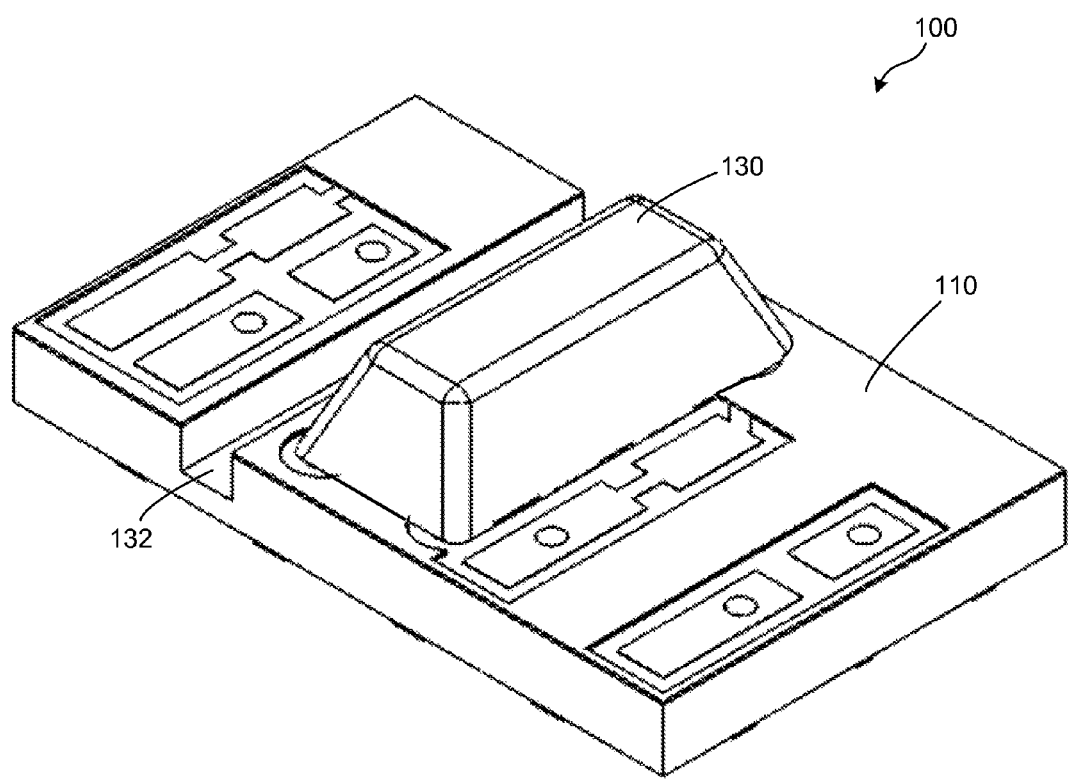
FIG. 3B illustrates a top perspective view of the embodiment of the portion of the proximity sensor device shown in FIG. 3A with a cover over the IC.

FIG. 3B illustrates the portion of a proximity sensor device 100 shown in FIG. 3A at a later stage of assembly after the IC 122 has been fitted with a cover 130 to provide physical and/or electrical protection for the IC 122. The cover 130 may be of a variety of materials and may be manufactured and attached to cover the IC 122 in a variety of ways; however, the cover 130 is typically a glob-top formed on the IC 122 and its wirebonds. Additionally, as shown in FIG. 3B, the device substrate 110 may include one or more substrate cutouts 132. The substrate cutout 132 illustrated in FIG. 3B is a channel cut into the upper surface of the device substrate 110 and allows for the later mounting of one or more component covers (not shown) to a protect various components of the proximity sensor device 100.

Figure 4:
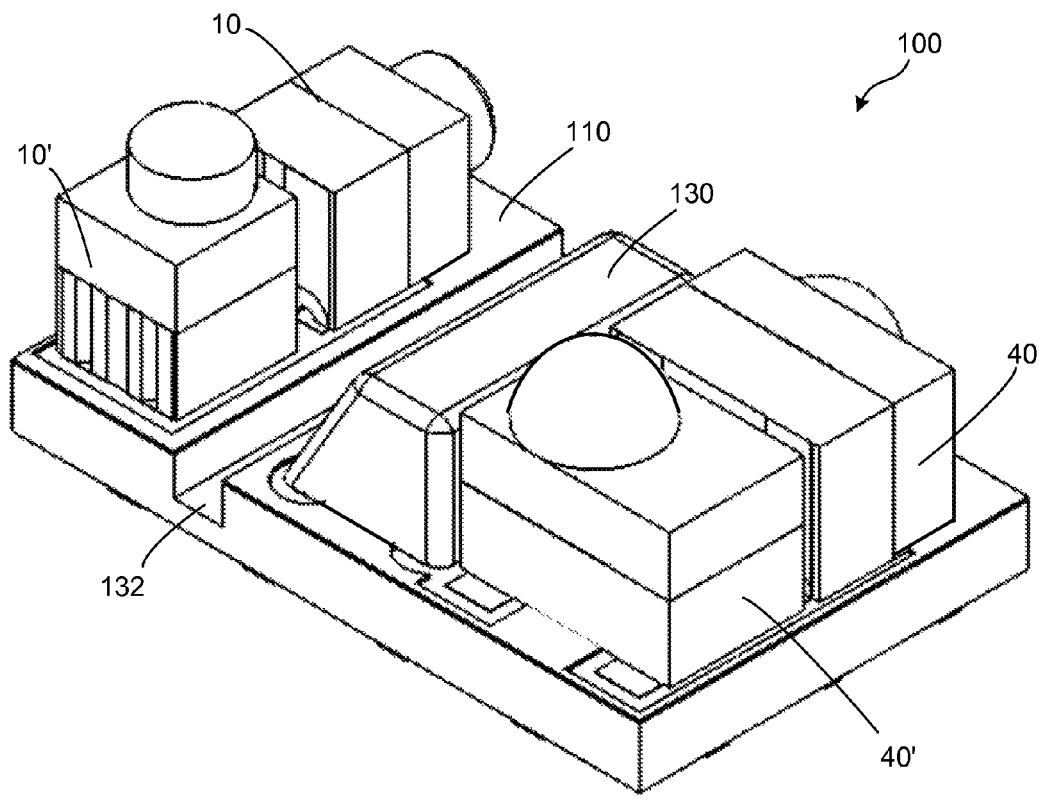
FIG. 4 illustrates a top perspective view of an embodiment of a proximity sensor device.

Turning to FIG. 4, the portion of the proximity sensor device 100 shown in FIG. 3B is shown with at least one transmitting unit 10 (FIG. 1B) and one receiving unit 40 (FIG. 2B) connected to the device substrate 110. As illustrated, the transmitting unit 10 is connected to the device substrate 110 such that light will be emitted from the transmitting unit 10 in a substantially horizontal direction with respect to the device substrate 110. Correspondingly, the receiving unit 40 is connected to the device substrate 110 such that light emitted in the horizontal direction from the transmitting unit 10 and reflecting off of an object (not shown) can be detected by the receiving unit 40.

Transmitting unit 10 and receiving unit 40 are also preferably connected to the device substrate 110 at conductive areas 114 and 118 (FIG. 3A), respectively, such that transmitting unit 10 and receiving unit 40 are electrically connected to IC 122 (not shown) that is protected by cover 130. In this way IC 122 can control the transmitting unit 10 and receiving unit 40, and allow those components to operate as an optical sensor in the horizontal direction.

Additionally, the preferred proximity sensor device 100 also includes an additional transmitting unit 10' and an additional receiving unit 40'. Transmitting unit 10' is connected to the device substrate 110 such that light will be emitted from the transmitting unit 10' in a substantially vertical direction with respect to the device substrate 110. Correspondingly, receiving unit 40' is connected to the device substrate 110 such that light emitted in the vertical direction from transmitting unit 10' and reflecting off of an object (not shown) can be detected by the receiving unit 40'.

Transmitting unit 10' and receiving unit 40' are preferably connected to the device substrate 110 at conductive areas 116 and 120 (FIG. 3A), respectively, such that transmitting unit 10' and receiving unit 40' are electrically connected to IC 122 (not shown) that is protected by cover 130. In this way, IC 122 can also control transmitting unit 10' and receiving unit 40', allowing those components to operate as an optical sensor in the vertical direction. Thus, transmitting unit 10/receiving unit 40 operating with transmitting unit 10'/receiving unit 40' provides proximity detection along two different directions, and in this illustrative embodiment, two different directions at 90 degrees to each other.

Figure 5:
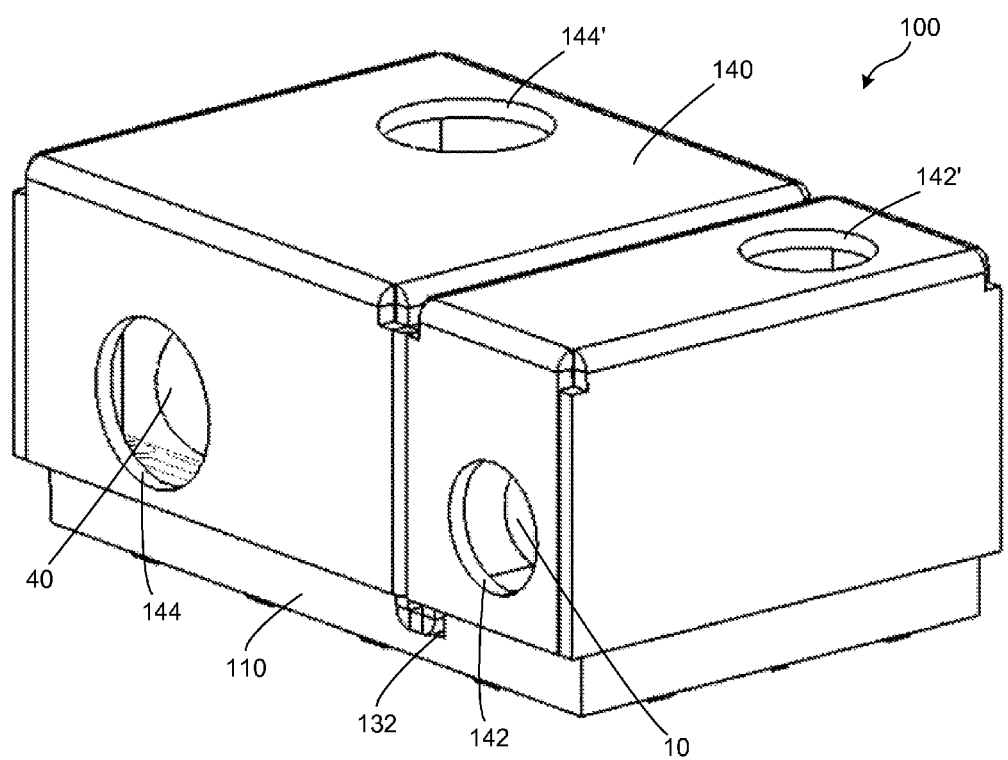
FIG. 5 illustrates a top perspective view of the proximity sensor device of FIG. 4 with an optional cover.

Optionally, the proximity sensor device 100 may also include a device cover 140, one embodiment of which is illustrated in FIG. 5. The device cover 140 may be made out of a variety of materials and may be attached to the device substrate 110 in a variety of ways. The device cover 140 includes transmitter cut-out portions 142, 142' to allow transmitting unit 10 (transmitting unit 10' not shown) to emit light through the device cover 140. Similarly, the device cover 140 includes receiver cut-out portions 144, 144' to allow receiving unit 40 (receiving unit 40' not shown) to receive light through the device cover 140. In addition to providing protection for the components of the proximity sensor device 100, the device cover 140 is also beneficial to prevent light not reflected from an object from accidentally leaking to the receiving units 40, 40' (i.e., reducing the crosstalk). Preventing such accidental light leakage can be especially beneficial when a small proximity sensor device 100 is desired, such as a proximity sensor device 100 that less than 1 cm in length and width.

In operation, the proximity sensor device 100 is able to provide detection in two directions simultaneously. For the illustrative embodiment, the proximity sensor device 100 provides detection in a first direction and a second direction that are perpendicular to each other. In this manner, the proximity sensor device 100 can provide three-dimensional proximity detection and/or provide a wide range of detection in a self-contained package. For example, due to the wide angle sensing properties for the dual-direction sensing, the proximity sensor device 100 can be used to detect objects (including animals or persons) entering, leaving or present in the field of detection. By way of example, the proximity sensor device 100 could be used as a human presence sensor to detect individuals approaching an ATM machine from various angles. Similarly, the proximity sensor device 100 could be used as a human presence sensor in other applications such as to detect the absence of a user from machinery, equipment, computers, mobile phones, etc., to allow implementation of a power saving or safety mode when a user is away, or to detect the presence of a user to enable a power up mode. In the illustrative embodiment, the IC 122 can be programmed with logic to implement such functionality and/or may be in communication with other devices that can provide logic for such functionality.

Additionally, as those skilled in the art would recognize, the proximity sensor device 100 could be used for other purposes, including industrial applications. For example, the proximity sensor device 100 could be used as a sensor for motors, belt drives, etc., to determine direction of motion (for example clockwise motion verses counterclockwise motion). In such implementations, the IC 122 could contain logic to identify the order in which the transmitting unit 10/receiving unit 40 and transmitting unit 10'/receiving unit 40' detect motion to determine the direction a movement. In this application, for example, detection by the transmitting unit 10/receiving unit 40 and then detection by the transmitting unit 10'/receiving unit 40' would mean motion in one direction while detection in the opposite order would mean motion in the opposite direction. Additional applications are also possible as will be recognized by those skilled in the art.

While various example embodiments of a proximity sensor and methods for the same have been described, it will be apparent to those skilled in the art that many more embodiments and implementations are possible that are within the scope of this disclosure. Accordingly, the described proximity sensor, components, and methods are not to be restricted or otherwise limited except in light of the attached claims and their equivalents.

What is claimed is:

1. A proximity sensor, comprising:
   a substrate with a length L and a width W, wherein L is less than is less than 10 millimeters and W is less than 5 millimeters;
   a first transmitting unit attached to the substrate, the first transmitting unit configured to transmit a first signal in a first direction;
   a first receiving unit attached to the substrate, the first receiving unit configured to receive at least a portion of the first signal transmitted in the first direction;
   a second transmitting unit attached to the substrate, the second transmitting unit configured to transmit a second signal in a second direction, wherein the second transmitting unit is adjacent to the first transmitting unit and the second signal in the second direction is perpendicular and does not intersect to the first signal in the first direction;
   a second receiving unit attached to the substrate, the second receiving unit configured to receive at least a portion of the second signal transmitted in the second direction; and
   logic in communication with the first transmitting unit, first receiving unit, second transmitting unit, and second receiving unit, the logic configured to detect whether at least a portion of the first signal transmitted from the first transmitting unit has been received by the first receiving unit or when at least a portion of the second signal transmitted from the second transmitting unit has been received by the second receiving unit.

2. The proximity sensor of claim 1, wherein the substrate is substantially rectangular and the first transmitting unit and second transmitting unit are light-emitting transmitting units.

3. The proximity sensor of claim 2, wherein the first transmitting unit is an LED.

4. The proximity sensor of claim 2, wherein the first transmitting unit comprises:
   a transmitter substrate;
   an LED device attached to one face of the transmitter substrate; and
   a lens formed by molding a compound over the LED device attached to the transmitter substrate.

5. The proximity sensor of claim 2, wherein the first receiving unit is a photodetector.

6. The proximity sensor of claim 2, wherein the first receiving unit comprises:
   a receiver substrate;
   a photodetector device attached to one face of the receiver substrate; and
   a lens formed by molding a compound over the photodetector device attached to the receiver substrate.

7. The proximity sensor of claim 1, wherein the logic comprises an integrated circuit attached to the substrate.

8. The proximity sensor of claim 1, wherein the proximity sensor further includes a cover attached to the substrate so as to surround at least the first receiving unit and second receiving unit, the cover configured with a first cut-out portion to allow the first receiving unit to receive at least a portion of the first signal and a second cut-out portion to allow the second receiving unit to receive at least a portion of the second signal.

9. A method for sensing comprising:
   providing a substrate, wherein the substrate has a length L and a width W, where L is less than 10 millimeters and W is less than 5 millimeters;
   attaching a first transmitting unit to the substrate, the first transmitting unit configured to transmit a first signal in a first direction;
   attaching a first receiving unit to the substrate, the first receiving unit configured to receive at least a portion of the first signal transmitted in the first direction;
   attaching a second transmitting unit to the substrate, the second transmitting unit configured to transmit a second signal in a second direction, wherein the second transmitting unit is adjacent to the first transmitting unit and the second signal in the second direction is perpendicular and does not intersect to the first signal in the first direction;
   attaching a second receiving unit to the substrate, the second receiving unit configured to receive at least a portion of the second signal transmitted in the second direction;
   providing logic in communication with the first transmitting unit, first receiving unit, second transmitting unit, and second receiving unit, the logic configured to detect whether the at least a portion of the first signal has been received by the first receiving unit or when the at least a portion of the second signal has been received by the second receiving unit.

10. The method of claim 9, wherein the substrate is substantially rectangular and the first transmitting unit and second transmitting unit are light-emitting transmitting units.

11. The method of claim 10, wherein the first transmitting unit is an LED.

12. The method of claim 10, wherein the first receiving unit is a photodetector.

13. The method of claim 9, wherein the logic comprises an integrated circuit attached to the substrate.

14. A method for sensing comprising:
   providing a substrate, wherein the substrate has a length L and a width W, where L is less than 10 millimeters and W is less than 5 millimeters;
   transmitting a signal in a direction from a first transmitting unit connected to the substrate;
   receiving at least part of the signal at a first receiving unit connected to the substrate;
   transmitting a second signal in a second direction from a second transmitting unit connected to the substrate, wherein the second transmitting unit is adjacent to the first transmitting unit and the second signal in the second direction is perpendicular and does not intersect to the first signal in the first direction;
   receiving at least part of the second signal at a second receiving unit connected to the substrate; and
   detecting whether the at least part of the signal has been received by the first receiving unit or the at least part of the second signal has been received by the second receiving unit.

15. The method of claim 14, wherein detecting whether the at least part of the signal has been received by the first receiving unit further comprises detecting when at least part of the signal has been received by the first receiving unit after reflecting off of an object.

16. The method of claim 14, wherein detecting whether the at least part of the signal has been received by the first receiving unit further comprises detecting when at least part of the signal is no longer being received by the first receiving unit after reflecting off of an object.

17. The method of claim 15 wherein the object is a person.

18. The method of claim 14, wherein detecting whether the at least part of the signal has been received by the first receiving unit or the at least part of the second signal has been received by the second receiving unit further comprises determining whether the first receiving unit receives at least part of the signal before the second receiving unit receives the at least part of the second signal.

* * * * *